United States Patent
Schmitt et al.

(10) Patent No.: US 12,235,591 B2
(45) Date of Patent: Feb. 25, 2025

(54) DEVICE AND METHOD FOR POSITIONING A SHADOW MASK

(71) Applicant: ABB Schweiz AG, Baden (CH)

(72) Inventors: Johannes Felix Holger Schmitt, Griesheim (DE); Jan Somboonvong, Erlangen (DE); Stefan Bleil, Bad Homburg (DE); Dominik Hoegenauer, Frankfurt am Main (DE)

(73) Assignee: ABB Schweiz AG, Baden (CH)

( * ) Notice: Subject to any disclaimer, the term of this patent is extended or adjusted under 35 U.S.C. 154(b) by 4 days.

(21) Appl. No.: 18/189,564

(22) Filed: Mar. 24, 2023

(65) Prior Publication Data

US 2023/0314961 A1    Oct. 5, 2023

(30) Foreign Application Priority Data

Mar. 30, 2022    (EP) .................................... 22165631

(51) Int. Cl.
*G03F 7/00*    (2006.01)
(52) U.S. Cl.
CPC ................................ *G03F 7/70775* (2013.01)
(58) Field of Classification Search
CPC .. G03F 7/70775; G03F 7/2045; G03F 7/2047; G03F 5/20; G03F 5/14; G03F 9/00; G03F 9/7003; G03F 9/7096; B25J 15/0608; H05K 1/00; C23C 14/042; C23C 14/50
See application file for complete search history.

(56) References Cited

U.S. PATENT DOCUMENTS

| | | |
|---|---|---|
| 3,789,336 A | 1/1974 | Gordin |
| 5,067,763 A | 11/1991 | Aoyama |
| 2005/0195488 A1* | 9/2005 | McCabe ............... G02F 1/1533 359/603 |
| 2011/0174217 A1 | 7/2011 | Gersdorff et al. |
| 2011/0304418 A1* | 12/2011 | Schuessler .............. G03F 7/707 335/289 |
| 2012/0122317 A1* | 5/2012 | Broekmaat ........... C23C 14/042 438/758 |
| 2014/0252380 A1 | 9/2014 | Lee et al. |
| 2019/0368024 A1* | 12/2019 | Heymanns ........ H01L 21/67712 |

FOREIGN PATENT DOCUMENTS

FR      1119582 A      6/1956
KR    10-2019-0114077 A    10/2019

OTHER PUBLICATIONS

European Patent Office, Extended European Search Report in European Patent Application No. 22165631.7, 8 pp. (Nov. 29, 2022).

* cited by examiner

*Primary Examiner* — Deoram Persaud
(74) *Attorney, Agent, or Firm* — Leydig, Voit & Mayer, Ltd.

(57) ABSTRACT

A device for positioning a shadow mask includes a mask application tool, the mask application tool comprising an inner body comprising, at an end surface of the inner body, one or more magnets. The mask application tool further comprises a hollow outer body for receiving the inner body, the outer body comprising, at an end surface of the outer body, a mask socket and one or more guide elements for positioning the mask application tool on a substrate tray.

20 Claims, 3 Drawing Sheets

DEVICE AND METHOD FOR POSITIONING A SHADOW MASK

CROSS-REFERENCE TO RELATED APPLICATIONS

This patent application claims priority to European Patent Application No. 22165631.7, filed on Mar. 30, 2022, which is incorporated herein in its entirety by reference.

FIELD OF THE DISCLOSURE

The present disclosure relates a device and a method for positioning a shadow mask.

BACKGROUND OF THE INVENTION

Shadow masks are used for selectively covering portions of a substrate prior to coating the substrate with materials to be deposited on the substrate. Substrates are often disk-shaped and the masked area often lies completely within the substrate without protruding the disk sideways. As an example, disk shaped substrates may be coated such that the coated area describes a circle around the disks surface with a straight line through the center of the disk.

Currently, shadow masks are applied using a lithography process. As an example, in a lithography process, a photo-sensitive lacquer is applied to the substrate surface and then a mask is put on top. After exposing the substrate to a light source, thereby exposing uncovered portions of the lacquer. The un-exposed parts of the lacquer are washed away, whereas the exposed parts remain on the substrate to form a mask. The masked substrates may then be coated, e.g. after being sent to a coating provider and coated. After coating, the lacquer, i.e., the sacrificial layer, is washed away and the substrate remains with the coating where needed.

Due to exposure to environmental conditions (for example, temperature, humidity, and dust) after forming the lacquer mask, for example during transportation, issues may arise that lead to the coating not properly sticking to the substrate. Various tests showed that quality could be improved by drying, e.g., in an oven, of the substrates right before coating. However, using a lithography process, the drying temperature is limited by the lacquer. The drying temperatures compatible with lacquer often do not yield satisfactory results.

Accordingly, the lithography-based process has various challenges. It involves the use of various chemicals, like lacquer, which are often hazardous and require special handling (including, for example, protecting the lacquer from unwanted exposure to light). Moreover, drying times are necessary, thereby limiting throughput. In addition, lithography may result in unsatisfactory results due to the heating temperatures being limited and also due to inaccuracies in different steps in the lithography process, which may accumulate, particularly due to several manual steps involved, which are particularly prone to errors or inaccuracies. Moreover, the waste incurred, e.g., the lacquer layer that is completely discarded over the course of the lithography process, and the use of the chemicals may be an issue of concern from an ecological point of view.

BRIEF SUMMARY OF THE INVENTION

In one general aspect, the present disclosure describes a device and a method for positioning a shadow mask that overcome at least some of the above challenges.

The disclosure describes a device for positioning a shadow mask, particularly a magnetic shadow mask. The device comprises a mask application tool, the mask application tool comprising an inner body comprising, at an end surface of the inner body, one or more magnets. The mask application tool further comprises a hollow outer body for receiving the inner body, the outer body comprising, at an end surface of the outer body, a mask socket and one or more guide elements for positioning the mask application tool on a substrate tray.

An advantage of such a device is that a magnetic shadow mask can be securely held by magnetic force of the magnets, positioned accurately directly onto a substrate placed on the substrate tray by means of the guide pins, and then released by retracting the inner body from the outer body, thereby decreasing the distance between the magnets and the mask in a controlled manner. Accordingly, a device for precisely positioning a shadow mask is provided.

Allowing for a precise positioning of the shadow mask directly onto the substrate allows for omitting the steps of lithography entirely, i.e., all steps related to the lacquer mask are not required. Instead, the precisely positioned mask can be used directly for coating. Accordingly, the challenges described above in the context of the lithography process are overcome.

Specifically, the production process is sped up, the use of the chemicals that may be hazardous and difficult to handle is eliminated, waste is reduced, and reliability, quality, and accuracy is improved by reducing the number of steps and by eliminating the temperature limitation for heating brought about by the lacquer. Overall process costs are also improved due to reduced time, reduced number of steps, and reduced amount of chemicals and equipment required. Thus, the device of the present disclosure fulfils the above objective.

An additional advantage is that the mask, contrary to the lacquer mask, can be re-used ensuring a high reproducibility of coating results.

In the present disclosure, when arrangements of elements are described, unless otherwise specified, this will refer to the device in a configuration for intended use, particularly, where applicable, in an assembled state.

The end surface of the inner body having the magnets may, in an arrangement for intended use, be the end surface corresponding to the end surface of the outer body having the mask socket. For example, the end surface of the outer body may be a base surface of a hollow cylinder and the end surface of the inner body may be a base surface of a cylinder with a cylinder axis parallel to that of the hollow cylinder. The inner body may be inserted with the base surface first into the outer body in an arrangement for intended use.

The shadow mask to be used is of a magnetic material. The shape of the shadow mask may be such that the shadow mask does not protrude the substrate, and, accordingly the substrate socket, in a plane parallel to the surface of the substrate.

The device of the present disclosure may further comprise a substrate tray. The substrate tray may comprise one or more first positioning elements. The substrate tray may further comprise one or more substrate sockets having at least one substrate portion and having at least one positioning portion configured to engage with at least one of the guide elements of the outer body, in particular so as to receive at least one of one or more guide pins and/or protrude into at least one of one or more guide bores of the outer body, so as to position the outer body with respect to the substrate tray.

The device of the present disclosure may further comprise a base plate assembly. The base plate assembly may comprise one or more second positioning elements each configured to engage with one of the first positioning elements so as to position the substrate tray with respect to the base plate assembly. The base plate assembly may further comprise one or more magnets, in particular wherein the one or more magnets are associated with the one or more substrate sockets such that each substrate socket is associated with at least one of the one or more magnets of the base plate assembly.

In other words, a substrate tray may be configured for receiving a substrate in each of the substrate sockets, thereby defining a substrate position, and to allow for properly positioning the mask application tool with respect to the substrates may be provided. Accordingly, accurate positioning of the shadow mask is ensured.

A magnet being associated with a substrate socket may comprise a magnet being arranged at least partially inside of or directly below the substrate in an assembled state, i.e., in a state where the substrate tray is positioned on the base plate assembly.

Each substrate socket may be associated with at least one separate magnet. Alternatively substrate sockets may share a magnet.

The first positioning elements and the second positioning elements may comprise one or more holes and/or one or more pins. In one embodiment, the positioning elements can include a pair of first and second positioning elements embodied as a hole and a pin.

The base plate assembly may comprise one or more plates, wherein at least one of the plates is configured to define the position of the magnets relative to the substrate tray in an assembled state.

In an assembled state, the base plate assembly may be aligned with the substrate tray via the first and second positioning elements, such that one or more magnets are arranged in an area of each substrate socket. For example, the base plate assembly may have a plate with an array of holes, e.g., the magnet positioning holes mentioned below, each hole defining the position of at least one of the magnets.

The magnets may be configured to hold the mask positioned on top of a substrate placed in the substrate tray in place.

BRIEF DESCRIPTION OF THE SEVERAL VIEWS OF THE DRAWING(S)

DETAILED DESCRIPTION OF THE INVENTION

Figure 1A:
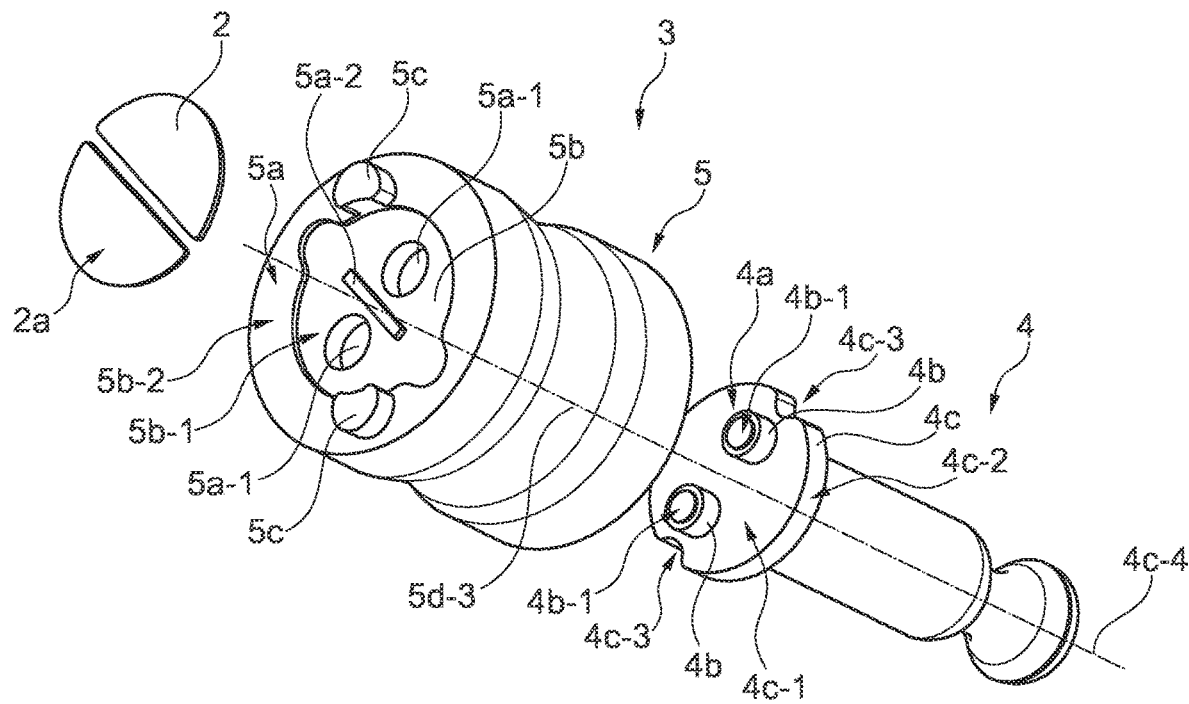
FIGS. 1a and 1b illustrate schematically two views of a mask application tool of a device according to the present disclosure.
Figure 1B:
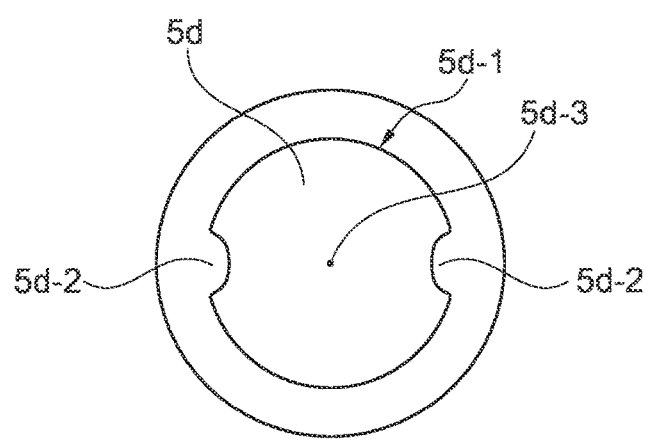

FIGS. 1a and 1b illustrate schematically an oblique view of a device 1 for positioning a shadow mask 2. The device comprises a mask application tool 3. The mask application tool comprises an inner body 4 and an outer body 5 for receiving the inner body. At the end surface 4a of the inner body, two magnets 4b are arranged. Specifically, the magnets 4b are arranged at a cylinder base 4c-1 of a cylinder-shaped portion 4c of the inner body 4. The cylinder-shaped portion forms the inner end of the inner body 4, i.e., the end that is inserted first into the hollow outer body 5. The cylinder surface 4c-2 of the cylinder-shaped portion 4c has two recesses 4c-3. The recesses extend in the direction of a cylinder axis 4c-4 of the cylinder-shaped portion.

The hollow outer body 5 has, arranged at its end surface 5a, a mask socket 5b and two guide elements 5c, in this example guide pins 5c protruding from the end surface 5a. The guide pins are configured for positioning the mask application tool on a substrate tray, e.g., by inserting them into corresponding holes or bores in a substrate tray.

The hollow outer body 5 has a cylinder-shaped opening 5d for receiving the inner body 4. Specifically, the recess may be arranged at the end of the outer body opposite the end surface 5a. The hollow outer body 5 in this example may be essentially shaped as a hollow cylinder. The cylinder surface 5d-1 of the cylinder-shaped opening 5d has two guide protrusions 5d-2 extending in the direction of a cylinder axis 5d-3 of the cylinder-shaped opening 5d.

The guide protrusions 5d-2 of the outer body are each configured to engage with one of the recesses 4c-3 of the inner body so as to guide a sliding movement of the cylinder-shaped portion 4c of the inner body along the cylinder axis 5d-3.

In the example shown in FIG. 1a, mask socket 5b is configured as a recess-portion 5b-1 for receiving the shadow mask 2. The end surface 5a of the outer body 5 has two openings 5a-1 located in the recess-portion 5b-1. These opening are configured to each receive one of the magnets 4b of the inner body 4. The mask application tool may optionally be configured such that an end surface 4b-1 of each magnet 4b is aligned with the end surface 5a of the outer body in the recess-portion 5b-1.

Optionally, the recess-portion 5b-1 may comprise a sub-division 5a-2, which is bar-shaped in this example, for mask-positioning. As can be understood from the semi-circular parts of the shadow mask 2, when placed in the recess-portion, will be prevented from significantly shifting or rotating due to the sub-division 5a-2.

The shadow mask 2 and the mask socket 5b, in particular the recess-portion 5b-1, are configured such that an outward-facing surface 2a of the shadow mask aligns with a portion 5b-2 of the mask socket 5b outside of, particularly adjacent to, the recess-portion 5b-1 when the shadow mask is placed in the recess-portion.

Figure 2:
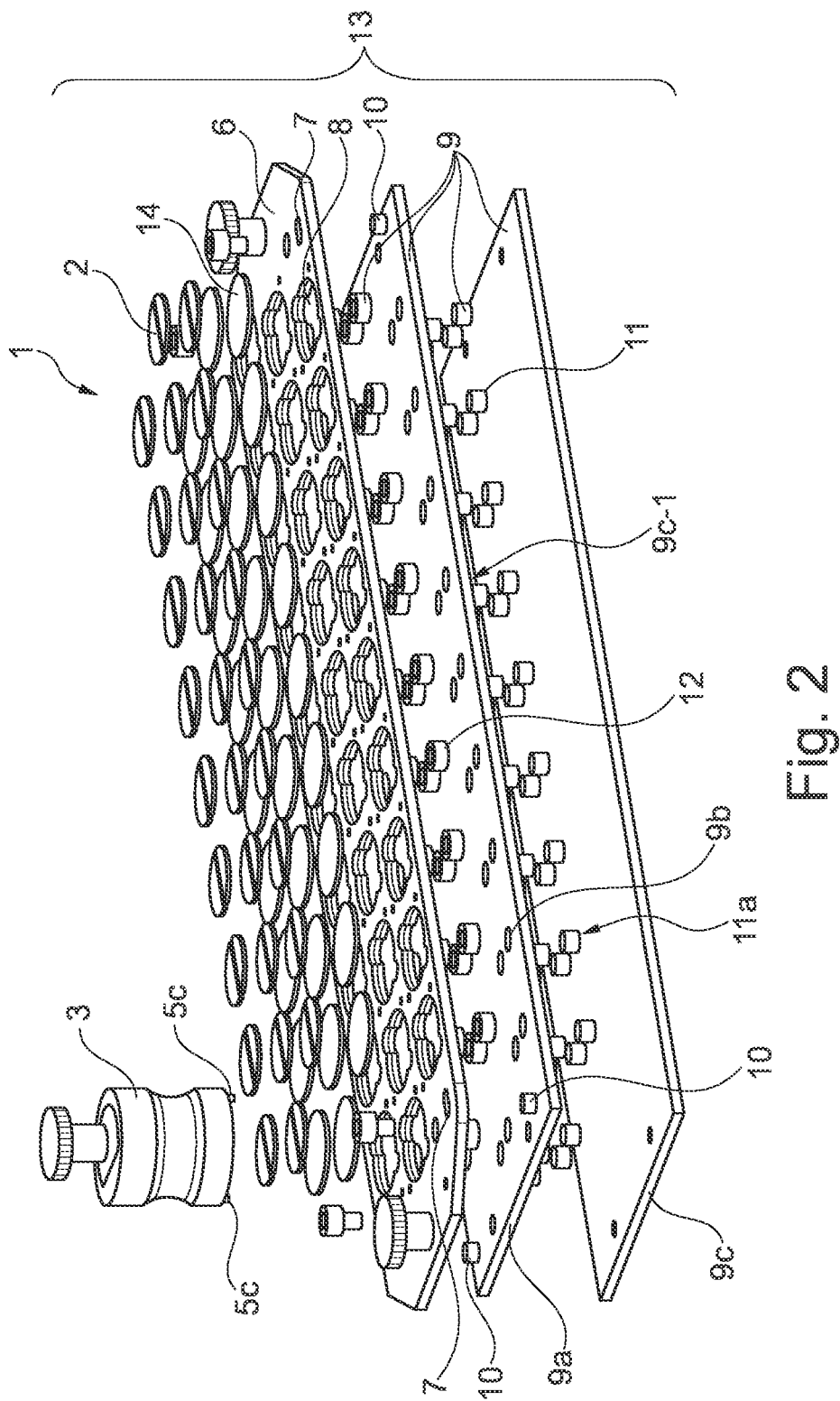
FIG. 2 illustrates schematically a system and device for positioning a shadow mask according to the present disclosure.

FIG. 2 shows a system 13 according to the present disclosure, which comprises a device 1 according to the present disclosure and a plurality of shadow masks 2, which are not part of the device 1.

A plurality of substrates 14, which are not part of the system, are also shown in FIG. 2 for the sake of illustration.

The device 1 comprises a mask application tool 3. The mask application tool is generally configured similarly to that of FIG. 1, except that the inner body and the opening of the hollow outer body and the guide elements 5c are differently shaped. Particularly, the inner body and the opening have an asymmetric shape to prevent rotation of the inner body in the outer body. The guide elements may have a base having a circular shape as shown in FIG. 2 or a base shaped as shown in FIG. 1a. Alternatively, instead of the mask application tool shown in FIG. 2, the device may comprise a mask application tool as described in the context of FIGS. 1*a* and 1*b* or another mask application tool according to the present disclosure.

In addition, the device comprises a substrate tray 6, also referred to as top tray, and a base plate assembly 9. The base plate assembly 9 comprises a first plate 9*a* with magnet positioning holes 9*b* and a second plate 9*c*. The base plate assembly also comprises magnets 11 that are positioned in the magnet positioning holes 9*b* in an assembled state. The second plate 9*c* supports the magnets from below in an assembled state. Magnet mounting screws 12 may hold the magnets in place.

The base plate assembly also comprises second positioning elements 10 such as pins extending upwards from the first plate 9*a*. The second positioning elements engage with corresponding first positioning elements 7 of the substrate tray 6, which may be slotted holes, each slotted hole configured to receive one of the second positioning elements 10, e.g., one of the pins.

The substrate tray also comprises substrate sockets 8, each configured to receive one substrate. The substrate socket also has a positioning portion configured for receiving the guide pins 5*c* of the mask application tool. An exemplary configuration of the substrate sockets 8 is explained in the context of FIGS. 3 and 4.

In the example shown in FIG. 2, for each of the sockets 8, two magnets 11 are provided. They are arranged, in an assembled state, directly below a substrate placed in the substrate socket.

Figure 3:
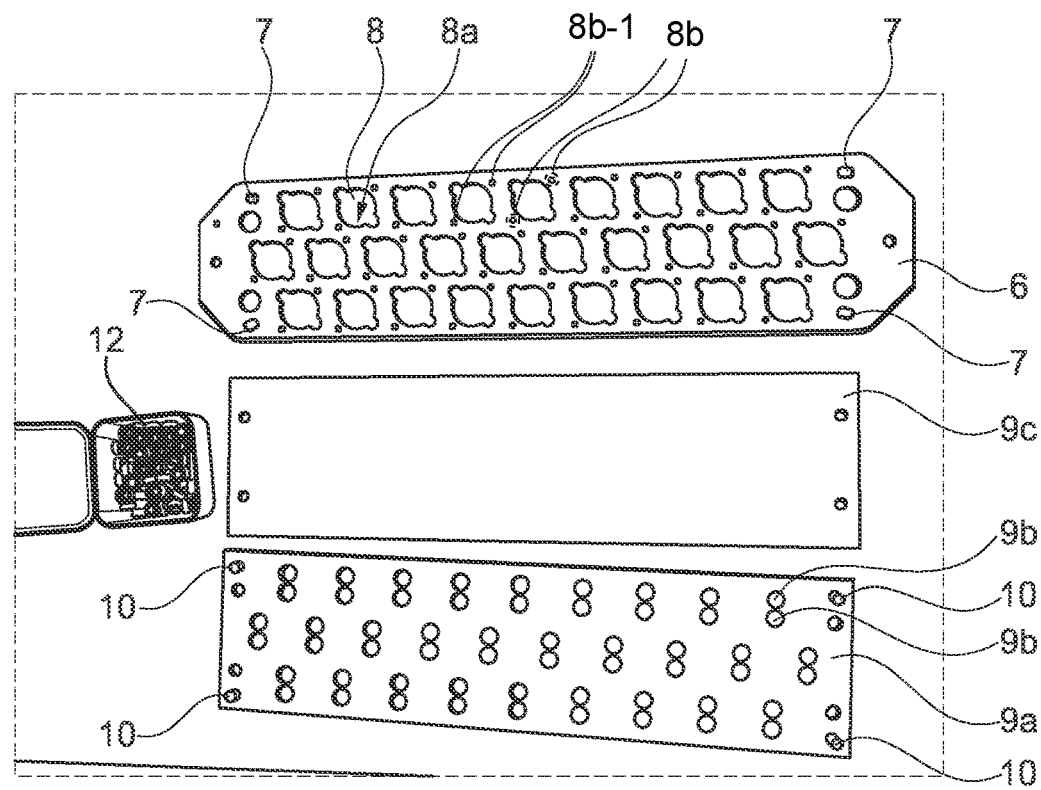
FIG. 3 illustrates schematically parts of a device for positioning a shadow mask according to the present disclosure.

FIG. 3 illustrates schematically parts of an exemplary device 1 for positioning a shadow mask according to the present disclosure, for example one of the above-described devices, in a disassembled state. FIG. 3 shows a first plate 9*a* and a second plate 9*c* of a base plate assembly 9 and a substrate tray 6. Magnet mounting screws 12 are also shown.

FIG. 3 illustrates that the substrate tray having a plurality, in this example four, of first positioning elements 7, here in the form of slotted holes. Moreover, the substrate tray is shown as having a plurality of substrate sockets 8, each configured to receive one substrate, e.g., in a substrate portion 8*a*, which is circular in this example. The substrate socket also has a positioning portion 8*b* comprising two positioning bores 8*b*-1, each configured for receiving one of the guide pins 5*c* of a mask application tool according to the present disclosure. Alternatively, the mask application tool may have guide bores as guide elements and the positioning portion may then have corresponding positioning pins to engage with the guide bores.

The first plate 9*a* of the base plate assembly is shown as comprising a plurality of magnet positioning holes 9*b*, particularly, two magnet positioning holes for each of the substrate sockets. In an assembled state, this means that two magnets will be arranged directly below each substrate socket.

The first plate 9*a* is also shown as having a plurality of, in this example four, second positioning elements 10. The second positioning elements 10 are each configured as pins. The pins extend upwards and, in an assembled state, are each received by one of the slotted holes.

In this example, in an assembled state, an end surface 11*a* of the one or more magnets 11, the end surface facing the second plate 9*c*, is aligned with a surface 9*a*-1 of the first plate 9*a* facing the second plate 9*c*.

Figure 4:
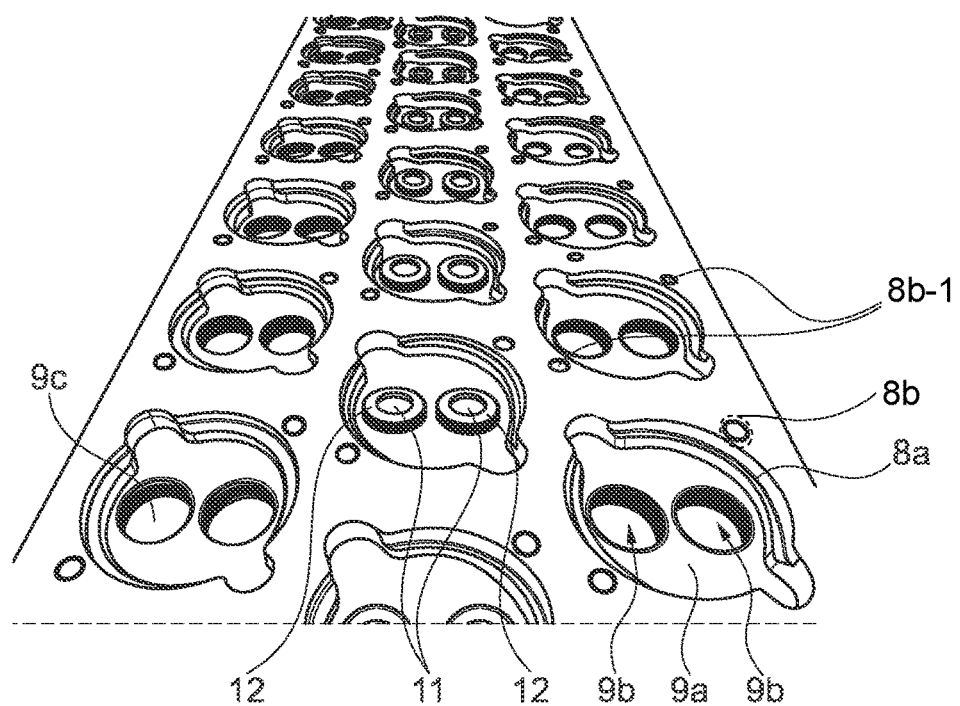
FIG. 4 illustrates schematically parts of a device for positioning a shadow mask according to the present disclosure.

FIG. 4 illustrates schematically parts of a device for positioning a shadow mask according to the present disclosure. The device is shown in a state wherein the substrate tray 6 is positioned on the base plate assembly 9. Here, for the sake of illustration, magnets 11 and magnet mounting screws 12 are only shown for some of the substrate sockets 8 to better illustrate the overall arrangement. In intended use, magnets 11 may be provided for each of the substrate sockets 8, in particular, two magnets for each substrate socket.

Since the same reference signs are used in FIG. 4 as in FIGS. 2 and 3 and the elements may be the same or similar as described in FIGS. 2 and 3, reference is made to the description of these features presented above in the context of FIGS. 2 and 3.

The device 1 according to the present disclosure may comprise the substrate tray 6 and base plate assembly 9 as shown in FIG. 2, 3, or 4, and any type of mask application tool 3, particularly the mask application tool as shown in FIG. 1 or FIG. 2.

It is noted that the device 1 for positioning a shadow mask according to the present disclosure may be used for/with other types of shadow masks than the ones shown in the Figures. Specifically, the Figures show a mask that is made of two pieces, i.e., two separate, in this example, essentially semicircular parts. Alternatively, a one-piece mask or a mask having more than two pieces may be applied with the claimed device. When the mask is a single-piece mask, it may be held by only one magnet of the mask application tool and only one magnet by the base plate assembly, or by two or more magnets, respectively. When the mask has more than two pieces, there may be one magnet for each of the pieces comprise in the mask application tool and one magnet for each of the pieces comprised in the base plate assembly.

In the following, an exemplary method for positioning a shadow mask according to the present disclosure, for example using a device or system as described in the context of FIGS. 1 to 4, is described. Moreover, optional steps preceding and following the positioning are also described below.

In step S1 the base plate assembly 9 is assembled, e.g., by placing magnets 11 in magnet positioning holes 9*b* of the first plate 9*a*, with the second plate 9*b* arranged below the first plate and the magnets. The magnets may be fixed by means of magnet mounting screws 12. The base plate assembly may then be kept as it is.

In step S2, substrates 14 are placed in the substrate sockets 8 of the substrate tray 6.

In step S3, the top tray with the substrates is heated in an oven, e.g., for drying.

In step S4, the substrate tray including the substrates is placed on top of the base plate assembly, specifically the first plate thereof, and positioned, e.g. by guide pins 10 of the base plate assembly and slotted holes 7 of the substrate tray.

In step S5, the mask is inserted in the outer body of the mask application tool 3 and held by the magnets 4*b* of the inner body 4 of the mask application tool.

In step S6, the application tool is positioned on the substrate tray using its guide pins 5*c* of the mask application tool, such that the mask is placed on one of the substrates.

In step S7, the inner body 4 is removed from the outer body 5 of the mask application tool, thereby moving the magnets 4*b* of the inner body away from the mask.

In step S8, the mask is being held in place by the magnets 11 of the base plate assembly underneath the substrate.

In step S9, the outer body 5 of the mask application tool is lifted from the substrate tray.

Steps S5 to S9 may be repeated for all substrates. Alternatively, they may be performed concurrently for a plurality, in particular all, of substrates using a plurality of mask application tools 3 or by using a modified mask application tool scaled to position a plurality of masks at the same time.

In step S10, with the masks positioned in the substrate sockets 8 and held in place by the magnets 11, a coating step is performed, wherein the substrate and masks are coated.

In step S11, the substrate tray including the substrates and masks is lifted from the base plate assembly. The masks are now no longer held in place by the magnets 11 of the base plate.

In step S12, the masks and substrates are removed from the substrate tray.

While the invention has been illustrated and described in detail in the drawings and foregoing description, such illustration and description are to be considered exemplary and not restrictive. The invention is not limited to the disclosed embodiments. In view of the foregoing description and drawings it will be evident to a person skilled in the art that various modifications may be made within the scope of the invention, as defined by the claims.

According to the present disclosure, the substrate tray may be mounted on the base plate assembly, in particular, so as to be arranged between the base plate assembly and the mask application tool. This arrangement refers to an assembled state with the mask application tool positioned, by means of the guide elements, on the substrate tray. Thus, the one or more magnets of the mask application tool will hold the shadow mask from the top and one or more magnets of the base plate assembly will hold the shadow mask from below, particularly, when a substrate is placed in the substrate tray, from below the substrate. This allows for a smooth transition from the mask being held by the mask application tool and the mask being held in place on the substrate, as will be explained in more detail below.

As outlined above, at the time of positioning the mask, the substrate tray may be arranged between the base plate assembly and the mask application tool, thereby, all elements are properly aligned and held in place. It is noted that at the mask will be held by the magnet of the mask application tool and the magnet of the base plate assembly while being positioned on the substrate. The mask is then released onto the substrate by sliding the inner body including the magnet of the mask application tool away from the mask, thereby decreasing the hold of said magnet on the mask.

The substrate tray may be mounted removably on the base plate assembly. Accordingly, the substrate tray may be separately used for any processing steps of the substrates, e.g., heating prior to coating. Moreover, by lifting the substrate tray from the base plate assembly, the hold of the magnets on the mask is decreased, thereby allowing for easy removal of the substrate and mask, which are then no longer held in place by the magnets.

As can be seen from the above, the mask may be held in place with one or more magnets from below the substrate to prevent movement during the coating process. After coating the masks can be removed easily by lifting the substrates away from the magnets by lifting the substrate tray from the base plate assembly.

The device may be configured such that the substrate tray and the base plate assembly can be taken apart without tooling.

It is noted that the magnets of the mask application tool and/or the magnets of the base plate assembly may be permanent magnets. Alternatively, the magnets, particularly the magnets of the base plate assembly, may be electromagnets.

According to the present disclosure, the substrate tray may be heat-resistant. This allows for heating of substrates placed on the substrate tray.

According to the present disclosure, the outer body may have a cylinder-shaped opening for receiving the inner body. Alternatively or in addition, the inner body may have a cylinder-shaped portion, the one or more magnets arranged at a cylinder base of the cylinder-shaped portion.

In particular, a cylinder surface of the cylinder-shaped portion may have one or more recesses extending in the direction of a cylinder axis of the cylinder-shaped portion and a cylinder surface of the cylinder-shaped opening may have one or more guide protrusions extending in the direction of a cylinder axis of the cylinder-shaped opening. The one or more guide protrusions may each be configured to engage with one of the recesses so as to guide a sliding movement of the cylinder-shaped portion along the cylinder axis of the cylinder-shaped opening.

Alternatively or in addition, one or more recesses extending in the direction of the cylinder axis of the cylinder-shaped opening may be provided in the cylinder surface of the cylinder-shaped opening and the cylinder surface of the cylinder-shaped portion may have one or more guide protrusions extending in the direction of the cylinder axis of the cylinder-shaped portion and the guide protrusions may each be configured to engage with one of the recesses so as to guide a sliding movement of the cylinder-shaped portion along the cylinder axis of the cylinder-shaped opening.

Thus, the movement of the inner body in the outer body can be controlled, allowing for more easily inserting the inner body, particularly in such a manner, that the magnets will be located in proper positions when the inner body is inserted. For example, if there are one or more openings configured to receive the magnets, as described below as an example, the inner body may be guided so as to easily insert the magnets into the openings.

Cylinder-shaped, in the present application, is not limited to a circular right cylinder. The cylinder shape may, for example, comprise a right cylinder having any base shape, including but not limited to a circular shape, a polygon-shape or an elliptical shape.

The cylinder-shaped portion may be fitted to be received by the outer body.

According to the present disclosure, the mask socket may be configured as a recess-portion for receiving the shadow mask and the end surface of the outer body may have one or more openings located in the recess-portion. The one or more openings may be configured to receive the one or more magnets of the inner body, in particular, such that an end surface of each magnet is aligned with or recessed with respect to the end surface of the outer body in the recess-portion. In an example, the openings may extend all the way from the recess-portion to the inside of the hollow outer body. As such, they may be through-holes through a wall of the outer body.

The recess portion may ensure a proper positioning of the mask on the mask application tool. The openings for receiving the magnets may allow for a strong hold of the magnets on the shadow mask that is not impeded by a wall separating the magnets from the shadow mask. However, the holes are not necessary, as long as the magnetic force is not shielded to such an extent that the magnet(s) cannot hold the mask.

According to the present disclosure, the recess-portion may comprise one or more sub-divisions for mask-positioning, particularly limiting rotational and/or translational movement of the shadow mask, particularly rotational and/or translational movements in a direction or plane parallel to the end surface of the outer body. A subdivision may be a portion that protrudes relative to the recess-portion.

According to the present disclosure, the one or more guide elements of the outer body may comprise at least two guide pins and/or at least two guide bores and/or at least one guide pin and at least one guide bore. The at least one positioning portion of the substrate tray may comprise at least two positioning bores and/or at least two positioning pins and/or at least one positioning bore and at least one positioning pin, each configured to engage with one of the guide elements of the outer body, in particular, to receive one of the guide pins of the outer body and/or protrude into one of the guide bores of the outer body.

According to the present disclosure a/each positioning bore and/or a/each positioning pin of the at least one positioning portion of the substrate tray may be configured to engage with one of the guide elements, in particular to receive one of the guide pins and/or protrude into one of the guide bores, of the outer body of the mask positioning tool such that a rotational and/or translational movement of the guide element is limited.

That is, a movement of the outer body with respect to the substrate tray may be limited by at least two guide elements of the outer body, each engaging with a corresponding element of the substrate tray. A guide element may be a guide pin and the corresponding element may be a positioning bore configured to receive the guide pin. A guide element may be a guide bore and the corresponding element may be a positioning pin configured to be received by the guide bore. Using at least two pairs of corresponding elements is easy for use, as it allows for at least two orientations for positioning the mask positioning tool.

The translational movement in this case may refer to translations in a direction parallel to the surface of the substrate tray facing the substrates. The rotational movement in this case may refer to a rotation in a plane parallel to the surface of the substrate tray facing the substrates.

According to the present disclosure, the mask application tool may be configured to apply a plurality of shadow masks concurrently, in particular, may comprise a plurality of mask sockets. For example, the mask application tool may have at least one magnet associated with each mask socket. It may have a plurality of inner bodies, in particular some or all of which may be movable independently of each other. Alternatively, it may have exactly one inner body. The mask application tool may be configured to apply one or more rows of masks concurrently. Concurrent application is advantageous in view of speed.

According to the present disclosure, the first positioning elements may comprise one or more holes and/or one or more pins and the second positioning elements may comprise one or more holes and/or one or more pins, in particular, a, in particular each, pair of first positioning elements and second positioning elements may comprise a hole and a pin.

According to the present disclosure, at least one of the one or more first positioning elements of the substrate tray may be configured as a hole, particularly as a slotted hole, configured to receive one of the second positioning elements of the base plate assembly, in particular one of the pins of the base plate assembly. Alternatively or in addition, at least one of the one or more second positioning elements of the base plate assembly may be configured as a hole, particularly as a slotted hole, configured to receive one of the first positioning elements of the substrate tray, in particular one of the pins of the substrate tray.

The first positioning elements and second positioning elements may comprise slotted holes and the pins, wherein the slotted holes may each be configured to receive one of the pins and to compensate heat expansion of the substrate tray in a direction perpendicular to an insertion direction of the pin into the slotted hole.

According to the present disclosure, the base plate assembly comprises at least a first plate comprising a/the one or more second positioning elements, particularly the one or more pins, and comprising one or more magnet positioning holes, each configured to position one of the one or more magnets of the base plate assembly in such a position as to be associated with one of the one or more substrate sockets.

Positioning of the magnets may here refer to shifting in a direction parallel to the substrate-facing surface of the base plate assembly, and optionally but not necessarily vertical movements. For example, the magnet positioning holes may be configured to be essentially form fitting with a respective magnet.

This allows for an easy to assemble and configure way of arranging the magnets in the proper position corresponding to the substrate sockets. High flexibility can be provided, as magnets can be added or removed in positions as needed depending on the substrate tray and/or type of substrate or mask for a given application.

According to the present disclosure, the one or more magnets of the base plate assembly may be attached to the first plate, in particular, wherein the one or more magnet positioning holes may be threaded holes and each of the one or more magnets of the base plate assembly may be screwed into one of the one or more magnet positioning holes.

Alternatively or in addition, the one or more magnets of the base plate assembly may each be screwed to a magnet mounting screw arranged between the first plate and the mask application tool.

Thus, the magnets can be held in place, particularly are not removed from the magnet positioning, while the above-mentioned flexibility is still maintained.

According to the present disclosure, the base plate assembly may comprise a second plate, wherein the first plate is arranged between the second plate and the substrate tray. In particular, the second plate may be configured to support the one or more magnets of the base plate assembly, i.e., the magnets may be supported by the second plate from the bottom.

According to the present disclosure, the first plate may, in particular, be mounted on top of the second plate, in particular mounted on top and in contact with second plate.

According to the present disclosure, an end surface of the one or more magnets of the base plate assembly facing the second plate may be aligned with a surface of the first plate facing the second plate.

Thus, the base plate assembly, in an assembled state, may properly hold the magnets in position, particularly, avoid that they fall from the first plate.

The present disclosure also provides a system for positioning a shadow mask. The system comprises the device of the present disclosure, e.g., a device as described above and/or claimed, and a magnetic shadow mask. The shadow mask and/or the mask socket, in particular the recess-portion for receiving the shadow mask, is/are configured such that an outward-facing surface of the shadow mask aligns with or protrudes over a portion of the mask socket outside of, particularly adjacent to, the recess-portion when the shadow mask is placed in the recess-portion. In particular, the shadow mask may align with or protrude over the entire end surface of the outer body.

The outward-facing surface of the shadow mask is the surface that will be placed onto the substrate. Accordingly, the mask aligning with or protruding over the surface may allow for making contact between mask and substrate without making contact between the outer body and the substrate. The shadow mask may be a, particularly re-usable, metal mask.

The present disclosure also provides method for positioning a shadow mask, particularly a magnetic shadow mask, using a device or system for positioning a shadow mask, in particular a device or system according to the present disclosure, e.g., as described above and/or claimed. The device comprises a mask application tool comprising an inner body comprising, at an end surface of the inner body, one or more magnets, and a hollow outer body for receiving the inner body, the outer body comprising, at an end surface of the outer body, a mask socket and one or more guide elements for positioning the mask application tool on a substrate tray.

The method of the present disclosure comprises placing the shadow mask into the mask socket. The method further comprises inserting, prior to or after placing the shadow mask into the mask socket, the inner body into the outer body so as to hold the shadow mask in the mask socket by means of the one or more magnets. The method further comprises positioning the mask application tool on a substrate tray using the one or more guide elements so as to position the shadow mask on a substrate arranged on the substrate tray, while holding the shadow mask in the mask socket by means of the one or more magnets. The method further comprises, after positioning the shadow mask on the substrate, partially or completely drawing the inner body from the outer body so as to release the shadow mask from the mask socket and, optionally, lifting the outer body from the substrate tray after releasing the shadow mask.

Inserting the inner body into the outer body so as to hold the shadow mask may entail inserting the inner body into the outer body until the magnets of the inner body are close to the shadow mask, for example, until the magnets are located in the openings in the recess-portion of the outer body. In this position, they will be close enough to properly hold the mask in place.

As an example, the shadow mask may be positioned in the mask tray while the mask tray is facing essentially upwards and after inserting the inner body so as to hold the shadow mask, the mask application tool may be turned such that the shadow mask faces downwards, e.g., facing towards the substrate tray with substrates facing upwards. In this orientation, the mask application tool may be positioned on the substrate tray.

Drawing the inner body away from the shadow mask, particularly drawing it partly or completely from the outer body, will release the shadow mask from the mask tray, as the hold of the magnets decreases. The mask application tool may then be lifted from the substrate tray, while the shadow mask remains on the substrate. Gravity and potentially magnets below the substrates may hold the shadow mask in place during this process.

The method of the present disclosure may comprise, prior to positioning the mask application tool on the substrate tray, placing one or more substrates including the substrate on the substrate tray, in particular into a substrate socket of the substrate tray, and subsequently positioning the substrate tray on top of a base plate assembly by means of first positioning elements of the substrate tray and second positioning elements of the base plate assembly, such that at least one of one or more magnets of the base plate assembly is arranged underneath the substrate.

As seen above, such magnets allow for holding the shadow mask in place, particularly while lifting the mask application tool and also during subsequent processing steps.

The one or more magnets being arranged underneath the substrate may comprise that the magnets are arranged directly below the substrate, for example.

The method of the present disclosure may comprise, while drawing the inner body from the outer body so as to release the shadow mask from the mask socket and, optionally, while lifting the outer body from the substrate tray after releasing the shadow mask, keeping the substrate tray positioned on top of the base plate assembly so as to hold the shadow mask in place by the at least one magnet of the base plate assembly.

The method of the present disclosure may comprise, after placing one or more substrates on the substrate tray and prior to positioning the substrate tray on top of a base plate assembly, performing a heating step, wherein the one or more substrates placed on the substrate tray are heated, for example in an oven.

For example, to dry the substrates, the top tray without magnets can be placed in an oven. Heating may be performed at temperatures up to 400° C. Thus moisture and residues may be removed from the substrates to a sufficient level.

Alternatively or in addition, the method of the present disclosure may comprise, after placing the positioning the shadow mask on the substrate on the substrate tray and particularly after performing a/the heating step, a coating step, while keeping the substrate tray positioned on top of the base plate assembly so as to hold the shadow mask in place by the at least one magnet of the base plate assembly.

Thus, it is possible to perform a heating step with any temperatures that are necessary for high quality, yet it is also possible to use more heat sensitive materials, e.g., the magnets, to hold the shadow masks in place. The relative positioning of the magnets can easily be achieved by the configuration of the substrate tray and base plate assembly.

The coating step may entail placing the base plate assembly with the substrate tray mounted thereon, the substrate(s) placed on the substrate tray, and the mask(s) positioned on the substrate(s) into a machine configured for coating substrates, e.g., by utilizing physical processes like sputtering. During the coating process the base plate assembly, substrate tray, the substrate(s), and the mask(s) may be exposed to temperatures above room temperature. During the coating, one or more layers of various thicknesses and materials may be applied.

Alternatively or in addition, the method of the present disclosure may comprise, after performing a/the coating step, lifting the substrate tray from the base plate assembly so as to release the shadow mask from the at least one magnet of the base plate assembly, and in particular, after lifting the substrate tray from the base plate assembly, removing the substrates from the substrate tray.

By lifting the substrate tray from the base plate assembly, the distance between the magnet and the shadow mask is decreased and the hold of the magnet on the shadow mask will decrease. Thus, the substrate and mask may then be taken from the tray easily.

The device of the present disclosure may comprise a mask removal tool configured to remove one or more masks. The mask removal tool may comprise one or more magnets, particularly one or more magnets configured to remove multiple masks at the same time, particularly in such a manner that translation movement of the mask or masks parallel to the substrate surface is avoided. The method of the present disclosure may comprise positioning each of a plurality of shadow masks on one of a plurality of substrates placed on the substrate tray sequentially, e.g., using the same mask application tool for each shadow mask. Alternatively, the present disclosure may comprise positioning each of a plurality of shadow masks on one of a plurality of substrates placed on the substrate tray concurrently by means of a plurality of the mask application tools or by means of a mask application tool configured to apply a plurality of shadow masks concurrently. Mask application tools that allow for applying a plurality of shadow masks concurrently have been described above.

The features and advantages outlined above in the context of the device for positioning a shadow mask similarly apply to the methods for positioning a shadow mask described herein.

Further features, examples, and advantages will become apparent from the detailed description making reference to the accompanying drawings.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A device for positioning a shadow mask, the device comprising:
   a mask application tool comprising:
   an inner body comprising, at an end surface of the inner body, one or more magnets, and
   a hollow outer body for receiving the inner body, the outer body comprising, at an end surface of the outer body, a mask socket and one or more guide elements for positioning the mask application tool on a substrate tray.

2. The device of claim 1, further comprising:
   a substrate tray (6) comprising:
   one or more first positioning elements, and
   one or more substrate sockets having at least one substrate portion and having at least one positioning portion configured to engage with at least one of the guide elements to receive at least one of one or more guide pins and/or protrude into at least one of one or more guide bores of the outer body to position the outer body with respect to the substrate tray; and
   a base plate assembly, comprising:
   one or more second positioning elements, each configured to engage with one of the first positioning elements to position the substrate tray with respect to the base plate assembly, and
   one or more magnets,
   wherein the one or more magnets are associated with the one or more substrate sockets such that each substrate socket is associated with at least one of the one or more magnets of the base plate assembly,
   wherein the substrate tray is mounted on the base plate assembly and is disposed between the base plate assembly and the mask application tool.

3. The device of claim 1, wherein the outer body has a cylinder-shaped opening for receiving the inner body, wherein the inner body has a cylinder-shaped portion, and wherein the one or more magnets arranged at a cylinder base of the cylinder-shaped portion.

4. The device of claim 3, wherein a cylinder surface of the cylinder-shaped portion has one or more recesses extending in a direction of a cylinder axis of the cylinder-shaped portion, wherein a cylinder surface of the cylinder-shaped opening has one or more guide protrusions extending in the direction of the cylinder axis of the cylinder-shaped opening, and wherein each of the one or more guide protrusions is configured to engage with one of the recesses to guide a sliding movement of the cylinder-shaped portion along the cylinder axis of the cylinder-shaped opening.

5. The device of claim 4, wherein a cylinder surface of the cylinder-shaped opening has one or more recesses extending in the direction of the cylinder axis of the cylinder-shaped opening and the cylinder surface of the cylinder-shaped portion has one or more guide protrusions extending in the direction of the cylinder axis of the cylinder-shaped portion, the one or more guide protrusions each configured to engage with one of the recesses so as to guide a sliding movement of the cylinder-shaped portion along the cylinder axis of the cylinder-shaped opening.

6. The device of claim 1, wherein the mask socket is configured as a recess-portion for receiving the shadow mask and wherein the end surface of the outer body has one or more openings located in the recess-portion and configured to receive the one or more magnets of the inner body such that an end surface of each magnet is aligned with or recessed with respect to the end surface of the outer body in the recess-portion.

7. The device of claim 6, wherein the recess-portion comprises one or more sub-divisions for mask-positioning, which limit rotational and/or translational movement of the shadow mask.

8. The device of claim 7, wherein the one or more guide elements of the outer body comprise at least two guide pins and/or at least two guide bores and/or at least one guide pin and at least one guide bore, and the at least one positioning portion of the substrate tray comprises at least two positioning bores and/or at least two positioning pins and/or at least one positioning bore and at least one positioning pin, each configured to engage with one of the guide elements of the outer body to receive one of the guide pins of the outer body and/or protrude into one of the guide bores of the outer body.

9. The device of claim 8, wherein a/each positioning bore and/or a/each positioning pin of the at least one positioning portion of the substrate tray is configured to engage with one of the guide elements to receive one of the guide pins and/or protrude into one of the guide bores of the outer body such that a rotational and/or translational movement of the guide element is limited; and wherein the mask application tool is configured to apply a plurality of shadow masks concurrently by including a plurality of mask sockets.

10. The device of claim 9, wherein the first positioning elements comprise one or more holes and/or one or more pins and wherein the second positioning elements comprise one or more holes and/or one or more pins, and wherein each pair of first positioning elements and second positioning elements comprises a hole and a pin.

11. The device of claim 10, wherein at least one of the one or more first positioning elements is configured as a slotted hole configured to receive one of the pins of the base plate assembly, and wherein at least one of the one or more second positioning elements is configured as a slotted hole and configured to receive one of the pins of the substrate tray.

12. The method of claim 11, further comprising, prior to positioning the mask application tool on the substrate tray, placing one or more substrates including the substrate on the substrate tray into a substrate socket of the substrate tray, and subsequently positioning the substrate tray on top of a base plate assembly utilizing first positioning elements of the substrate tray and second positioning elements of the base plate assembly, such that at least one of one or more magnets of the base plate assembly is arranged underneath the substrate.

13. The method of claim 12, further comprising, while drawing the inner body from the outer body to release the shadow mask from the mask socket and while lifting the outer body from the substrate tray after releasing the shadow mask, keeping the substrate tray positioned on top of the base plate assembly to hold the shadow mask in place by the at least one magnet of the base plate assembly.

14. The method of claim 12, further comprising:
after placing one or more substrates on the substrate tray and prior to positioning the substrate tray on top of a base plate assembly, performing a heating step, wherein the one or more substrates placed on the substrate tray are heated;
after placing the positioning the shadow mask on the substrate on the substrate tray and after performing a/the heating step, performing a coating step, while keeping the substrate tray positioned on top of the base plate assembly to hold the shadow mask in place by the at least one magnet of the base plate assembly; and
after performing the coating step, lifting the substrate tray from the base plate assembly to release the shadow mask from the at least one magnet of the base plate assembly, removing the substrates from the substrate tray.

15. The device of claim 11, wherein the slotted holes are configured to receive one of the pins and to compensate heat expansion of the substrate tray in a direction perpendicular to an insertion direction of the pin into the slotted hole.

16. The device of claim 15, wherein the base plate assembly comprises at least a first plate comprising a/the one or more pins, and comprising one or more magnet positioning holes, each configured to position one of the one or more magnets of the base plate assembly in such a position as to be associated with one of the one or more substrate sockets.

17. The device of claim 16, wherein the one or more magnets of the base plate assembly are attached to the first plate, wherein the one or more magnet positioning holes are threaded holes and each of the one or more magnets of the base plate assembly is screwed into one of the one or more magnet positioning holes, and wherein the one or more magnets of the base plate assembly are each screwed to a magnet mounting screw arranged between the first plate and the mask application tool.

18. The device of claim 17, wherein the base plate assembly comprises a second plate, wherein the first plate is arranged between the second plate and the substrate tray, the second plate configured to support the one or more magnets of the base plate assembly, wherein the first plate is mounted on top of the second plate and/or wherein an end surface of the one or more magnets of the base plate assembly facing the second plate is aligned with a surface of the first plate facing the second plate.

19. A method for positioning a shadow mask using a device or system for positioning a shadow mask, wherein the device comprises a mask application tool comprising an inner body comprising, at an end surface of the inner body, one or more magnets, and a hollow outer body for receiving the inner body, the outer body comprising, at an end surface of the outer body, a mask socket and one or more guide elements for positioning the mask application tool on a substrate tray, and wherein the method comprises:
placing the shadow mask into the mask socket;
inserting, prior to or after placing the shadow mask into the mask socket, the inner body into the outer body to hold the shadow mask in the mask socket utilizing the one or more magnets;
positioning the mask application tool on a substrate tray using the one or more guide elements to position the shadow mask on a substrate arranged on the substrate tray, while holding the shadow mask in the mask socket utilizing the one or more magnets; and
after positioning the shadow mask on the substrate, partially or completely drawing the inner body from the outer body to release the shadow mask from the mask socket and lifting the outer body from the substrate tray after releasing the shadow mask.

20. The method of claim 19, further comprising positioning each of a plurality of shadow masks on one of a plurality of substrates placed on the substrate tray sequentially or concurrently utilizing a plurality of mask application tools.

* * * * *